United States Patent [19]

Wollnik

[11] Patent Number: 4,486,664
[45] Date of Patent: Dec. 4, 1984

[54] ARRANGEMENT AND PROCESS FOR ADJUSTING IMAGING SYSTEMS

[76] Inventor: Hermann Wollnik, Auf der Platte 30, D-6301 Fernwald 2, Fed. Rep. of Germany

[21] Appl. No.: 401,614

[22] Filed: Jul. 26, 1982

[30] Foreign Application Priority Data

Jul. 31, 1981 [DE] Fed. Rep. of Germany ......... 130276

[51] Int. Cl.³ .................... B01D 59/44; H01J 35/00
[52] U.S. Cl. .................... 250/396 R; 250/292; 313/361.1
[58] Field of Search .................... 250/292, 296, 396 R, 250/396 ML; 313/361

[56] References Cited

U.S. PATENT DOCUMENTS

| | | | |
|---|---|---|---|
| 3,423,706 | 1/1969 | Sampson et al. | 250/396 ML |
| 3,501,631 | 3/1970 | Arnold | 250/292 |
| 3,920,985 | 11/1975 | Hiller et al. | 250/292 |
| 3,935,453 | 1/1976 | Liebl | 250/292 |
| 4,174,479 | 11/1979 | Tuithof et al. | 250/292 |
| 4,360,760 | 11/1982 | Brodowski | 250/396 R |

Primary Examiner—Bruce C. Anderson
Attorney, Agent, or Firm—Flehr, Hohbach, Test, Albritton & Herbert

[57] ABSTRACT

An arrangement and a process for adjusting imaging systems for bundles of charged particles, or for adjusting spectrometers for bundles of charged particles, are indicated, in which arrangement and process electric and/or magnetic correcting elements are used, which possess, in every case, a large number of electrodes and/or current conductors, which are arranged, symmetrically or asymmetrically, around the optical axis of the particle bundle, these electrodes being at potentials such that the resulting potentials V (r, $\Phi$) at an azimuth angle ($\Phi$) to a cylindrical surface at a radius (r) around an optical axis (Z) can be represented as the sum of $V_1$ and $V_2$, or, as the case may be, these current conductors carrying currents such that the magnitudes of the resulting currents I (r, $\Phi$) at the azimuth angle ($\Phi$), as defined above, can be represented as the sum of $I_1$ and $I_2$. The expressions $V_1$, $V_2$ and $I_1$, $I_2$ can, in their turn, be represented as sums, their addends being, respectively, of the type $V_1 = V_{1k} \sin k\Phi$, $V_2 = V_{2k} \cos k\Phi$, and $I_1 = I_{1k} \sin k\Phi$ and $I_2 = I_{2k} \cos k\Phi$, where k = 1, 2, ... P, with P representing the order of the multipole. The potentials and/or the currents are utilized, in this manner, to obtain superpositions of electric and/or magnetic dipoles, quadrupoles, hexapoles, etc.

24 Claims, 3 Drawing Figures

ARRANGEMENT AND PROCESS FOR ADJUSTING IMAGING SYSTEMS

The invention relates to an arrangement and a process for adjusting imaging systems for bundles of charged particles, or for adjusting spectrometers for bundles of charged particles, in which arrangement and process one or more electric and/or magnetic correcting elements are used.

BACKGROUND OF THE INVENTION

In an spectrometer for charged particles, or in an imaging system for charged particles, the adjustment of the relative position and/or the intensities of the individual components is conventionally carried out by means of mechanical adjustments in order to ensure that the beam, or bundle, of charged particles passes through the apparatus in the desired manner. Whereas focussing and adjustment by mechanical means is associated with major expense, there has been a trend towards carrying out the adjustment by means of electric and/or magnetic correcting elements, in order both to deflect the particle bundle and to twist its optical axis in such a manner that it finally passes through all the components of the imaging system or, as the case may be, of the spectrometer, at the correct point, on the one hand, and with the correct and desired orientation, on the other hand.

The object of the invention is accordingly to indicate an arrangement and a process for adjusting an imaging system for bundles of charged particles, or for adjusting a spectrometer for bundles of charged particles, this arrangement and process enabling the required regulation and ajustment to be carried out in a simple and desirable manner.

SUMMARY OF THE INVENTION

This objective is attained in a satisfactory manner, according to the invention, various electric and magnetic correcting elements being used, which form electric and/or magnetic multipoles, potentials or, as the case may be, currents being applied to their electrodes or current conductors in a specific manner, as explained in detail in the text below. If appropriate, a plurality of electric and/or magnetic correcting elements of this type, will be arranged, in succession, in the flight direction of the charged particles, in order to ensure the desired fine focussing and adjustment. The various electrodes and/or current conductors can be controlled individually, or by means of one or more process computers, which take account of the prevailing conditions.

DESCRIPTION OF THE PREFERRED EMBODIMENTS

Figure 1:
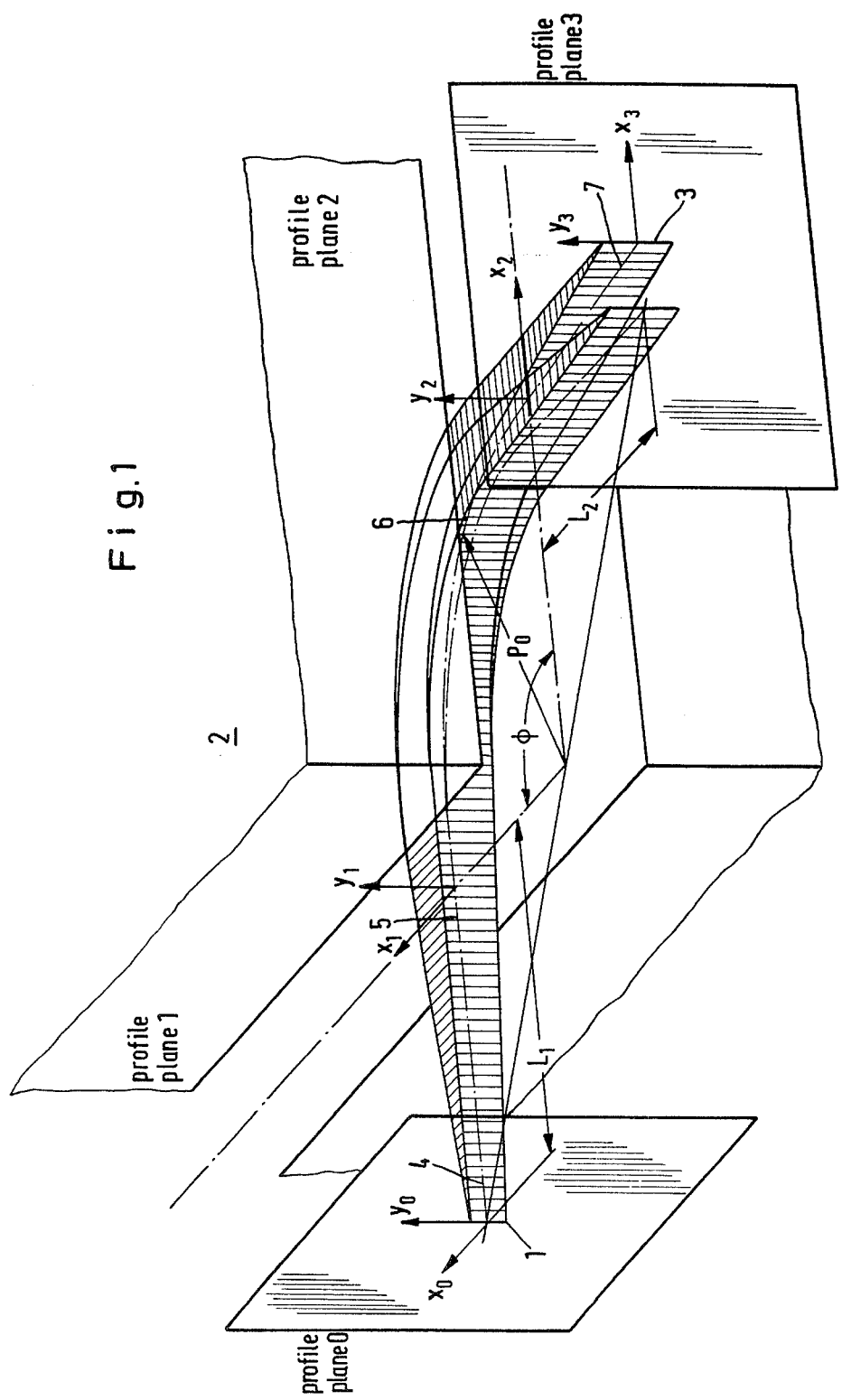
FIG. 1 shows a diagrammatic representation, in perspective, for explaining the conditions in an imaging system for bundles of charged particles.

It is intended, first of all, to explain the conditions in an imaging system for bundles of charged particles, or in a spectrometer for bundles of charged particles, in more detail, by reference to FIG. 1, which shows how a bundle of charged particles leaves a slit-diaphragm 1 of a particle source, which is not represented, is deflected in a magnetic sector-field 2, and is finally focussed in an image 3 of the slit-diaphragm 1, separated according to their momenta and their charge.

If it is assumed that mechanical means are provided for coarsely adjusting the imaging system, the following conditions must therefore be additionally fulfilled, as precisely as possible, in order to achieve good focussing:

1. The optical axis of the particle bundle must enter the magnetic sector-field 2 at a defined point, located centrally between the two poleshoes, so that the relationship $x_1 = y_1 = 0$ holds. This condition can be effectively satisfied when the particle bundle is deflected by a suitable amount, in the x-direction and/or in the y-direction, at point 4, that is to say, at a short distance from the particle source or, as the case may be, from the slit-diaphragm 1 which forms the entry slit.

2. The particle bundle must pass through the magnetic field in such a manner that the optical axis of the particle bundle is located, on the exit side of the magnetic field, at a defined point, which is located centrally between the poleshoes, so that the relationship $x_2 = y_2 = 0$ holds. This condition can be effectively satisfied when the particle bundle is deflected, by a suitable amount, in the x-direction and/or the y-direction, at point 5, shortly before entering the magnetic sector-field 2. This condition can, however, also be achieved by deflecting the particle bundle at point 4.

3. The optical axis of the particle bundle must pass through the exit slit at a preset point, so that the relationship $x_3 = y_3 = 0$ holds. This condition can be effectively satisfied when the particle bundle is deflected, by a suitable amount, in the x-direction and/or the y-direction, at point 4, shortly after emerging from the magnetic field. This condition can, however, also be achieved by arranging for the particle bundle to be deflected at point 4 and/or point 5.

Figure 2:
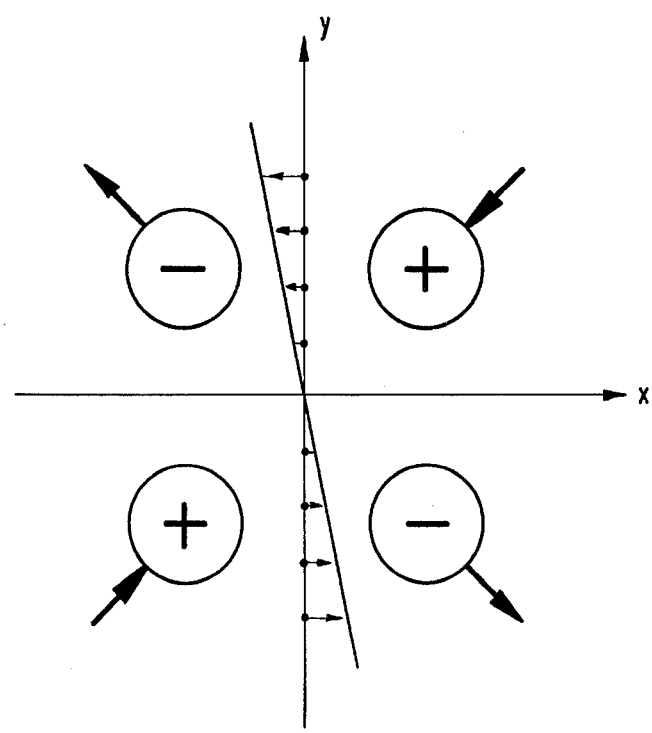
FIG. 2 shows a diagrammatic cross-section through an electrostatic quadrupole.

4. The image of the entry slit 1 must be parallel to the exit slit 3. This condition can be effectively satisfied when not only are all the particles of the bundle required to undergo the same deflection, as near as possible to the entry slit 1, that is to say, approximately at point 4, compare Condition 1, but when, in addition, all the particles are deflected a little in the x-direction. At the same time, the magnitude of this deflection must be proportional to the distance $y_o$, at which the individual particles are distant from the plane of symmetry $y+0$. This can be achieved by means of a magnetic coil or an electrostatic quadrupole, at point 4, but the four quadrupole pole-pieces must not be fitted, as usual, at the positions $x_o = \pm G_o$, $y_o = 0$ and $x_o = 0$, $y_o = \pm G_o$. On the contrary, the quadrupole pole-pieces must be located at the points $x_o = y_o = \pm G_o \sqrt{2}$ and $x_o = -y_o = \pm G_o \sqrt{2}$, that is to say, on straight lines which are twisted, relative to the optical axis, through an angle of 45°, as diagrammatically indicated in FIG. 2.

Even if it is not absolutely necessary, it is generally advisable to provide a second quadrupole of this type, but with reversed polarities, at a short distance beyond point 4, or, alternatively, to provide it only later, at point 5 in the representation according to FIG. 1., this second quadrupole cancelling the angular twist produced by the first quadrupole, and rendering rays, which were originally parallel to the axis, referred to the optical axis of the particle bundle, parallel to the axis again.

This twisting of the beam, or bundle of charged particles, can, of course, also be delayed to shortly before the exit slit, that is to say, to approximately the point 7.

5. With regard to the focussing in the x-direction, the object/image relationship, between the entry and exit slits, must be as precise as possible. This can be achieved by introducing electric and/or magnetic lenses, of a suitable strength, into the optical path, that is to say, at approximately the positions marked with the reference numbers 5 and 6, and, if it is desired to employ quadrupole lenses for this purpose, it is advisable to use at least two lenses of this type, in order to avoid excessive changes in the focussing action of the overall system in the y-direction.

6. The aberrations in the x-direction should remain small in every case. However, in spite of optimum design, residual aberrations frequently occur, which can be corrected, at least partially, by means of higher-order multipoles. In this context, it is possible, for example, to consider the curvature of the image of the entry slit 1, which can be corrected by means of a hexapole, shortly after the entry slit 1, or shortly before the exit slit 3.

Adjustments of the type described above can, to a substantial extent, be carried out by means of a series of deflecting, focussing and aberration-correcting elements, but, in doing so, the fact that a very large number of elements are generally involved renders the adjustments difficult, while, moreover, all these elements must be mutually matched with regard to their deflection directions, and this alignment must be carried out in a precise manner.

Figure 3:
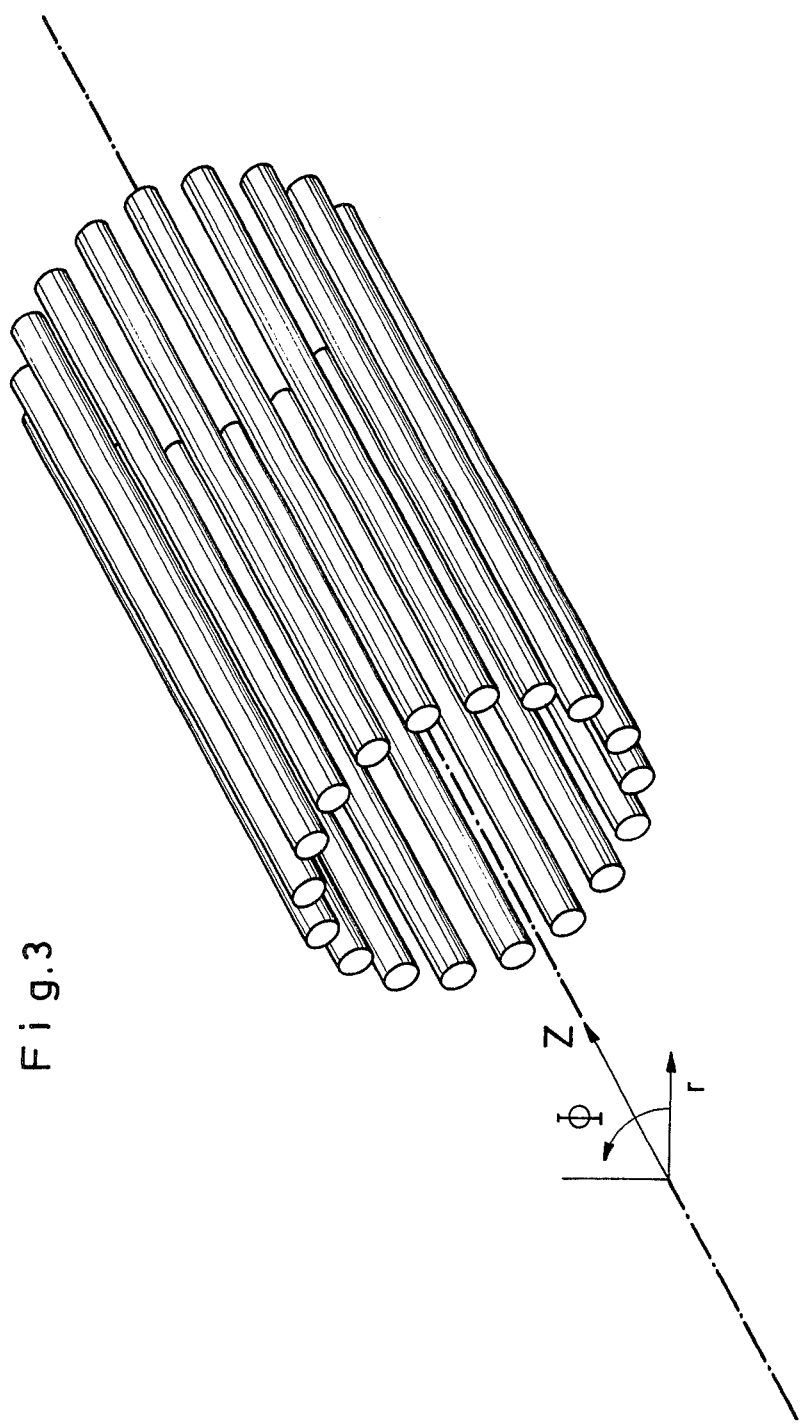
FIG. 3 shows a diagrammatic representation, in perspective, of a correcting element for an arrangement and a process according to the invention.

If electrostatic and/or magnetic correcting elements are used, as schematically indicated for an illustrative embodiment, by way of example, in FIG. 3, in which example the electrodes and/or current conductors are located, at equal angular intervals, on a circular peripheral line around the optical axis Z, it is thus possible, by altering the potentials V at the individual electrodes, and/or by altering the currents I through the individual conductors, to adjust, as desired, both the magnitude and the direction of the deflection of the charged particles. At the same time, the large number of electrodes and/or of current conductors, through which current flows, can be arranged symmetrically or asymmetrically around the optical axis of the particle bundle, it being possible, certainly, for the electrodes and/or the current conductors to run parallel to the optical axis Z, but at different distances from this axis, that is to say, also on the peripheral line of a rectangle, through the central point of which the optical axis Z passes.

In the case of electrostatic multipoles, potentials are applied to the electrodes such that the resulting potential $V(r,\Phi)$ at the azimuth angle $\Phi$ to a cylindrical surface having a specified radius r about a straight optical axis or, as the case may be, to a corresponding toroidal surface around a curved optical axis, can be represented as the sum of $$V_1 = V_{11} \sin \Phi + V_{12} \sin 2\Phi + V_{13} \sin 3\Phi + V_{14} \sin 4\Phi + V_{15} \sin 5\Phi + V_{16} \sin 6\Phi$$

and $$V_2 = V_{21} \cos \Phi + V_{22} \cos 2\Phi + V_{23} \cos 3\Phi + V_{24} \cos 4\Phi + V_{25} \cos 5\Phi + V_{26} \cos 6\Phi$$

it being possible to set the coefficients $V_{1k}$ and $V_{2k}$, which indicate the magnitudes of the individual potentials, by selecting values for $k = 1, 2, 3, 4, 5, 6$, as desired.

In this manner, it is possible to produce superpositions of an electrostatic dipole, of a quadrupole, of a hexapole, of an octapole, of a decapole, and/or of a duodecapole, in which superpositions the orientation, relative to the angle $\Phi$, and the strength of each individual multipole being adjustable as desired.

Different multipoles can be produced, and superposed, by varying the individual terms and partial sums in the total sum, which is equivalent to the resulting potential.

In one embodiment, for example, N electrodes are arranged parallel to the optical axis, and at a preset radial distance R around this axis, at angular intervals which are given, in each case, by $$\Phi_M M 2\pi/N$$

where $$M = 1, 2, 3 \ldots N$$

so that it is possible to represent the potential $\overline{V} = \overline{V}(\Phi_M)$ of each of these electrodes as the sum of the potentials $$\overline{V}_1 = V_{11} \sin \Phi_M + V_{12} \sin 2\Phi_M + V_{13} \sin 3\Phi_M + V_{14} \sin 4\Phi_M + V_{15} \sin 5\Phi_M + V_{16} \sin 6\Phi_M$$

and $$\overline{V}_2 = V_{21} \cos \Phi_M + V_{22} \cos 2\Phi_M + V_{23} \cos 3\Phi_M + V_{24} \cos 4\Phi_M + V_{25} \cos 5\Phi_M + V_{26} \cos 6\Phi_M$$

In a corresponding manner, magnetic correcting elements can be used, these correcting elements possessing a large number N of conductors, through which current flows, and which are arranged, symmetrically or asymmetrically, around the optical axis Z of the particle bundle, and through which electric currents which are, in general, dissimilar, flow. These currents give rise to a magnetic flux density B, which can also be obtained by means of conductors which are arranged parallel to the optical axis Z, at a uniform radial distance R therefrom, and through which currents flow, of magnitudes such that the current density i can be represented, as a function of the azimuth angle $\Phi$, relative, in the case of a straight optical axis, to a cylindrical surface, or relative, in the case of a curved optical axis, to a toroidal surface, as the sum of various terms, which are a function both of the prevailing current densities, and of the azimuth angles in question. The current density can then be described as the sum of $$i_1 = i_{11} \sin \Phi + i_{12} \sin 2\Phi + i_{13} \sin 3\Phi + i_{14} \sin 4\Phi + i_{15} \sin 5\Phi + i_{16} \sin 6\Phi$$

and $$i_2 = i_{21} \cos \Phi + i_{22} \cos 2\Phi + i_{23} \cos 3\Phi + i_{24} \cos 4\Phi + i_{25} \cos 5\Phi + i_{26} \cos 6\Phi$$

it being possible to set the coefficients $i_{1k}$ and $i_{2k}$, as desired, by selecting values for $k = 1, 2, 3, 4, 5$ and 6. As a result, the currents in the current conductors produce a superposition of a magnetic dipole, of a quadrupole, of a hexapole, of an octapole, of a decapole, and/or of a duodecapole, the orientation, relative to the angle $\Phi = 0$, and the strength of each individual multipole being adjustable as desired.

In a specific embodiment according to the invention, N current conductors are arranged parallel to the optical axis Z, at a preset radial distance R around this axis, at equal angular intervals, and, in particular, at the angles $$\Phi_M = M 2\pi/N$$

where $$M = 0, 1, 2, \ldots N-1,$$

so that it is possible to represent the currents $I = I(\phi_M)$ in each of these current conductors as the sum of $$I_{1M} = I_{11} \sin \Phi_M + I_{12} \sin 2\Phi_M + I_{13} \sin 3\Phi_M + I_{14} \sin 4\Phi_M + I_{15} \sin 5\Phi_M + I_{16} \sin 6\Phi_M$$

and $$I_{2M} = I_{21} \cos \Phi_M + I_{22} \cos 2\Phi_M + I_{23} \cos 3\Phi_M + I_{24} \cos 4\Phi_M + I_{25} \cos 5\Phi_M + I_{26} \cos 6\Phi_M$$

In another embodiment according to the invention, all the current conductors are, certainly, likewise arranged parallel to the optical axis, but at different distances therefrom, so that their periphery forms a rectangle with the optical axis Z passing through its central point.

If, in the sums indicated above, the partial sums $V_{11} \sin \Phi + V_{21} \cos \Phi$ and $i_{11} \sin \Phi + i_{21} \cos \Phi$ are considered, it is realised that both the magnitudes and the directions of the deflections can be adjusted as desired. If the partial sums $V_{21} \sin 2\Phi + V_{22} \cos 2\Phi$ and $i_{21} \sin 2\Phi + i_{22} \cos 2\Phi$ are considered, it is possible, by applying additional potentials and currents to appropriate electrodes and current conductors, to superpose a quadrupole field on a deflecting field of this type, it being likewise possible, in this case also, to adjust the strength and the focussing direction of this quadrupole as desired.

In the case of a pre-existing multipole field of this nature, it is possible to superpose hexapole fields by further modification and/or application of potentials and currents to the appropriate electrodes and current conductors, as is evident from considering the partial sums $V_{31} \sin 3\Phi + V_{32} \cos 3\Phi$ and $i_{31} \sin 3\Phi + i_{32} \cos 3\Phi$, it being likewise possible to adjust the strength and the focussing direction of the hexapoles as desired. Still higher multipoles can be integrated into the corresponding correcting element, in a corresponding manner.

At the same time, it is found, in an advantageous manner, that a large number of adjustments can be carried out by means of only a few correcting elements. A further advantage is evident in the fact that the deflection directions of the individual dipoles, quadrupoles, hexapoles, octopoles, decapoles, and/or duodecapoles of a single correcting element, and moreover, of different correcting elements, can easily be aligned parallel to one another, and with respect to a reference plane. If more complicated adjusting operations are involved, these can thus be carried out within a short time, by employing iterations, with repetitive adjusting steps, to arrive at the optimum setting.

Even though, in the above text, mention has only been made, by way of example, of sine functions and cosine functions in the individual terms, the invention is, in no case, restricted to them, on the contrary, they can also be replaced by other orthogonal functions.

Attention should, moreover, be drawn to the fact that although six coefficients $V_{1k}$, $V_{2k}$ and $i_{1k}$, $i_{2k}$ with $k = 1$ to 6, are provided twice, in each case, in the equations cited in the illustrative embodiments described, it is however possible to use, as required, both fewer terms and, correspondingly, fewer electrodes and current conductors, so that a multipole of a lower order results. It is also possible, in the same manner, to use multipoles of higher order, the potentials and/or currents, in each case, being applied in an analogous extension of the equations explained in the text above, that is to say, the additional addends have, quite generally, the form $$V_{1k} \sin k\Phi, \; V_{2k} \cos k\Phi$$

and/or $$i_{1k} \sin k\Phi, \; i_{2k} \cos k\Phi$$

where $$k = 1, 2, \ldots P,$$

P being the order of the electric or, as the case may be, of the magnetic multipole.

If multipoles of a correspondingly higher order are used, the shaping of the electric and/or magnetic multipole field can be controlled to suit, since, for example, only a few coefficients are other than zero, for example only the coefficients $V_{11}$, $V_{21}$ and/or $I_{11}$, $I_{21}$, while the remaining coefficients are zero, or their corresponding terms are disregarded.

The coefficients $V_{1k}$, $V_{2k}$ and $i_{1k}$, $i_{2k}$, in which k is, in general, 1, 2, ... P, can be preset by means of appropriate potentials or currents, it being possible to employ networks of resistors, diodes, and/or transistors, in order to apportion the potentials and currents to the individual electrodes or current conductors, in accordance with the function describing their deflection effects in terms of azimuth angle.

The potentials of the individual electrodes, or the currents in the individual current conductors, can be set, in each case, by means of one or more process computers. In these computers, it is possible, for example, to employ a large number of digital/analog converters operating in parallel, or one or more digital/analog converters and analog multiplexers with an appropriate number of outputs and short-term analog memory devices.

In a further development of the invention, arrangements are provided for adjusting the magnitudes of the coefficients $V_{1k}$, $V_{2k}$ and $i_{1k}$, $i_{2k}$, in which $k = 1$ to 6, or the magnitudes of the potentials of all the electrodes, and of the currents in all the current conductors, belonging, in each case, to the correcting elements, as well as the magnitudes of the potentials and currents in other components which are employed for deflecting or focussing in the particle spectrometer or, in general, in an imaging system, one or more process computers being used to effect these adjustments. In such an arrangement, the adjustment is effected as a function of the particle-current distribution in the image plane, or in an intermediate image plane, or as a function of the particle-current signals in the final target or targets, on in intermediate targets, when the particle bundle is modified in a defined manner by one or more correcting elements, to the zero-th, 1st, 2nd, 3rd, 4th or 5th approximation. This process can involve a deflection or focusing operation, or impression with aberrations of the 2nd, 3rd, 4th and 5th orders, it also being possible to provide, in addition to the controlled correcting elements, additional deflecting capacitors, or short deflecting magnets, with flux lines perpendicular to the optical axis, and/or beam-twisting magnet coils, with flux lines running parallel to the optical axis.

Using the correcting elements described above, an adjustment operation can be carried out, for example, as a whole, in the following manner:

A. A modulation of the signal from a spectral line is obtained, beyond the exit slit, by periodically varying the magnitude of one of the deflecting fields. By activating a selected correcting element, in proportion to the variation of the magnetic sector-field, this modulation can be partially or completely compensated, depending on the amplitude of the potential or current used to activate the correcting element, when the azimuth angle $\Phi_n$ of the deflection of the selected n-th correcting element has been suitably rotated.

If all the correcting elements are successively activated, in this manner, with respect to their deflection effects, it is thus possible to indicate, for each k-th correcting element, through which azimuth angle $\Phi_k = \Delta\Phi k$ the deflection in this corrector would have had to be twisted in order to coincide with the deflection direction of the selected n-th deflecting field. The deflection direction of all the other deflecting fields must then be fine adjusted, either mechanically, to that of the reference deflecting field, or the particle bundle must be twisted, in a suitable manner, by means of quadrupoles, according to FIG. 2, or by means of magnet coils, the axes of which coincide with the optical axis of the particle bundle.

B. By adjusting the magnitude of the deflection effect of a correcting element, in general of the first correcting element in the flight direction of the charged particles, the particle bundle can be allowed to pass through the exit slit at maximum intensity.

C. By adjusting the deflection power of the quadrupole component of a correcting element, shortly before, or after one of the magnetic sector-fields, it is then possible to focus the particle bundle in the x-direction, in the optimum manner, that is to say, the beam width is reduced to a minimum value at the location of the exit slit. If the divergence angle of the particle beam, in the x-direction, is too small to allow this minimum setting to be accomplished in a distinct manner, it is also possible to apply, by means of a deflecting capacitor, fitted a short distance beyond the entry slit 1, a reciprocating deflection of the particle beam, and thereby to effect a virtual enlargement of the aperture angle. It is also possible, instead of a deflecting capacitor of this type, to employ the deflecting effect of the first correcting element of the system as a whole.

D. By adjusting the quadrupole component of the first correcting element, this component being twisted through 45°, and possibly by adjusting the second correcting element or, alternatively, the last correcting element, the particle beam can be twisted in such a manner that the image of the entry slit 1 is parallel to the exit slit 3.

It proves expedient to carry out the steps B., C. and D., listed above, several times, in an iterative manner, until the particle beam, or the particle bundle, comes through the exit slit 3 at the optimum intensity. This iterative process can also be followed by a process aimed at optimizing or minimizing the aberrations, by means of the hexapole, decapole, and duodecapole components of the correcting elements, again carried out in an iterative manner.

The invention can, with the correcting elements indicated, be employed in the most diverse fields, in order to carry out the adjustments or optimisation of mass spectrometers, ion separators, implantation units, electron microscopes, or particle accelerators. In applying the invention, it is particularly advantageous if the subassemblies or elements, described above, are activated with the aid of a process computer, it being possible, for example, to equip each electrode with a short-term memory device, for example in the form of a capacitor, which is charged, in accordance with the computer program, to the voltage required at the moment in question.

In the process which has been described, the potentials $V = V(\Phi)$ and the currents $I = I(\Phi)$ can be composed of a large number of individual terms, the magnitudes of which depend on the coefficients $V_{ij}$ and $I_{ij}$, in which $i = 1,2$ and $j = 1,2, \ldots P$, where P indicates the order of the multipole. The magnitude of the angle $\Phi$ is determined, in its turn, by the quotients $V_{1i}/V_{2i}$ or $I_{1i}/I_{2i}$, where $i = 1,2, \ldots P$, where P again indicates the order of the multipole.

I claim:

1. Arrangement for adjusting an imaging system for bundles of charged particles, or for adjusting a spectrometer for bundles of charged particles, by means of one or more electrostatic correcting elements, characterised in that each of these correcting elements possesses a large number (N) of electrodes, which are arranged, symmetrically or asymmetrically, around the optical axis (Z) of the particle bundle, and are at potentials such that the resulting potential ($V(r,\Phi)$) at an azimuth angle ($\Phi$) relative to a cylindrical surface at a specified radius (r) around a straight optical axis (Z) or, as the case may be, relative to a corresponding toroidal surface around a curved axis, can be represented as the sum of $$V_1 = V_{11} \sin \Phi + V_{12} \sin 2\Phi + V_{13} \sin 3\Phi + V_{14} \sin 4\Phi + V_{15} \sin 5\Phi + V_{16} \sin 6\Phi$$

and $$V_2 = V_{21} \cos \Phi + V_{22} \cos 2\Phi + V_{23} \cos 3\Phi + V_{24} \cos \Phi + V_{24} \cos 4\Phi + V_{25} \cos 5\Phi + V_{26} \cos 6\Phi$$

it being possible to set the coefficients $V_{1k}$ and $V_{2k}$, as desired, by selecting values for k from k = 1 to 6, so that the potentials represent a superposition of an electric dipole, of a quadrupole, of a hexapole, of an octapole, of a decapole, and/or of a duodecapole, the orientation and strength of each individual multipole, relative to the angle $\Phi = 0$, being in every case adjustable as desired.

2. Arrangement according to claim 1, characterised in that N electrodes are arranged parallel to the optical axis, and at a preset radial distance (R) around this axis, at angular intervals which are given, in each case, by $$\Phi_m = M 2\pi/N$$

where $M = 1,2,3 \ldots N$ it being possible to represent the potential $\overline{V} = \overline{V}(\Phi_M)$ of each of these electrodes as the sum of the potentials $$\overline{V}_1 = V_{11} \sin \Phi_M + V_{12} \sin 2\Phi_M + V_{13} \sin 3\Phi_M + V_{14} \sin 4\Phi_M V_{15} \sin 5\Phi_M + V_{16} \sin 6\Phi_M$$

and $$\overline{V}_2 = V_{21} \cos \Phi_M + V_{22} \cos 2\Phi_M + V_{23} \cos 3\Phi_M + V_{24} \cos 4\Phi_M + V_{25} \cos 5\Phi_M + V_{26} \cos 6\Phi_M$$

3. Arrangement according to claims 1 or 2, characterised in that all the electrodes extend parallel to the optical axis (Z), and at different distances therefrom, so that their periphery forms a rectangle, with the optical axis (Z) passing through its central point.

4. Arrangement for adjusting an imaging system for bundles of charged particles, or for adjusting a spectrometer for bundles of charged particles, by means of one or more magnetic correcting elements, characterised in that each of these correcting elements possesses a large number (N) of conductors, through which current flows, and which are arranged, symmetrically or asymmetrically, around the optical axis (Z) of the particle bundle, and through which electric currents which are, in general, dissimilar, flow, these currents giving rise to a magnetic flux density (B) which can also be obtained by means of conductors which are arranged parallel to the optical axis (Z), at a uniform radial distance (R) therefrom, and through which currents flow, of magnitudes such that the current density (i) can be represented, as a function of the azimuth angle ($\Phi$) relative, in the case of a straight optical axis (Z), to this cylindrical surface, or relative, in the case of a curved optical axis, to this toroidal surface, by the sum of $$i_1 = i_{11} \sin \Phi + i_{12} \sin 2\Phi + i_{13} \sin 3\Phi = i_{14} \sin 4\Phi + i_{15} \sin 5\Phi + i_{16} \sin 6\Phi$$

and $$i_2 = i_{21} \cos \Phi + i_{22} \cos 2\Phi + i_{23} \cos 3\Phi + i_{24} \cos 4\Phi + i_{25} \cos 5\Phi + i_{26} \cos 6\Phi,$$

it being possible to set the coefficients $i_{1k}$ and $i_{2k}$, as desired, by selecting values for k from k=1 to 6, so that the currents produce a superposition of a magnetic dipole, of a quadrupole, of a hexapole, of an octapole, of a decapole, and/or of a duodecapole, the orientation, relative to the angle $\Phi=0$, and the strength of each individual multipole being in every case adjustable as desired.

5. Arrangement according to claim 4, characterised in that N current conductors are arranged parallel to the optical axis (Z), and at a preset radial distance (R) around this axis, at angular intervals which are given, in each case, by $$\Phi_M = M2\pi/N$$

where
M = 0, 1, 2, ... N−1 it being possible to represent the magnitude of the current $I = I(\Phi_M)$ in each of these conductors as the sum of $$I_{1M} = I_{11} \sin \Phi_M + I_{12} \sin 2\Phi_M + I_{13} \sin 3\Phi_M + I_{14} \sin 4\Phi_M + I_{15} \sin 5\Phi_M + I_{16} \sin 6\Phi_M$$

and $$I_{2M} = I_{21} \cos \Phi_M + I_{22} \cos 2\Phi_M + I_{23} \cos 3\Phi_M + I_{24} \cos 4\Phi_M + I_{25} \cos 5\Phi_M + I_{26} \cos 6\Phi_M$$

6. Arrangement according to claim 4, characterised in that all the current conductors extend parallel to the optical axis, but at different distances therefrom, so that their periphery forms a rectangle, with the optical axis (Z) passing through its central point.

7. Arrangement according to claims 1 or 4, characterised in that the sine functions and cosine functions are replaced by other orthogonal functions.

8. Arrangement according to any one of claims 1 to 7, characterised in that both electrodes and current conductors are provided, the electrodes for producing electrical multipole fields, and the conductors for producing magnetic multipole fields.

9. Arrangement according to any one of claims 1 to 8, characterised in that only some of the coefficients $V_{1k}$, $V_{2k}$ and $i_{1k}$, $i_{2k}$ are specified in advance, by prescribing values for k from k=1 to 6, for example only the coefficients $V_{11}$, $V_{21}$ and $i_{11}$, $i_{21}$, while the remaining coefficients are zero, or the terms corresponding to them are disregarded.

10. Arrangement according to any one of claims 1 to 9, characterised in that the coefficients $V_{1k}$, $V_{2k}$ and $i_{1k}$, $i_{2k}$, in which k=1 to 6, are defined by preset potentials or currents, a network of resistors, diodes and/or transistors being provided to apportion these potentials and currents to the individual electrodes or current conductors, in accordance with the function ($\Phi$, $\Phi_M$) describing their deflection effects in terms of azimuth angle.

11. Arrangement according to any one of claims 1 to 9, characterised in that the potentials of the individual electrodes, or the currents in the individual current conductors, can be set by means of one or more process computers, in particular by means of a large number of digital/analog converters operating in parallel, or by means of one or more digital/analog converters and analog multiplexers with an appropriate number of outputs and short-term analog memory devices.

12. Arrangement according to any one of claims 1 to 11, characterised in that the magnitudes of the coefficients $V_{1k}$, $V_{2k}$ and $i_{1k}$, $i_{2k}$, in which k=1 to 6, or the magnitudes of the potentials of all the electrodes, and of the currents in all the current conductors, belonging, in each case, to the correcting elements, as well as the magnitudes of the potentials and currents in other components which are employed, in the particle spectrometer or imaging system, for deflecting or focussing purposes, can be adjusted by one or more process computers, the adjustment being effected as a function of the particle-current distribution in the image plane, or in an intermediate image plane, or as a function of the particle-current signals in the final target or targets, or in intermediate targets, when the particle bundle is modified in a defined manner by one or more correcting elements, to the zero-th, 1st, 2nd, 3rd, 4th or 5th approximation, that is to say, when it is deflected or focussed, and/or has aberrations of the 2nd, 3rd, 4th and 5th orders impressed on it, additional deflecting capacitors, or short deflecting magnets, with flux lines perpendicular to the optical axis (Z), and/or beam-twisting magnet coils, with flux lines running parallel to the optical axis, being provided in addition to the controlled correcting elements.

13. Process for adjusting an imaging system for bundles of charged particles, or for adjusting a spectrometer for bundles of charged particles, this process employing one or more electrostatic correcting elements, characterised in that (N) electrodes are used for each correcting element, these electrodes being arranged, symmetrically or asymmetrically, around the optical axis of the particle bundle, and being maintained at potentials such that the resulting potential $V(r,\Phi)$ at the azimuth angle ($\Phi$) relative to a cylindrical surface at a specified radius (r) around a straight optical axis (Z), or, as the case may be, relative to a corresponding toroidal surface around a curved optical axis, can be represented as the sum of $$V_1 = V_{11} \sin \Phi + V_{12} \sin 2\Phi + V_{13} \sin 3\Phi + V_{14} \sin 4\Phi + V_{15} \sin 5\Phi + V_{16} \sin 6\Phi$$

and $$V_2 = V_{21} \cos \Phi + V_{22} \cos 2\Phi + V_{23} \cos 3\Phi + V_{24} \cos 4\Phi + V_{25} \cos 5\Phi + V_{26} \cos 6\Phi$$

it being possible to set the coefficients $V_{1k}$ and $V_{2k}$, as desired, by selecting values for k from $k = 1$ to $k = 6$, so that the potentials represent a superposition of an electric dipole, of a quadrupole, of a hexapole, of an octapole, of a decapole, and/or of a duodecapole, the orientation, relative to the angle $\Phi = 0$, and the strength of each individual multipole, being in every case adjustable as desired.

14. Process according to claim 13, characterised in that N electrodes are used, parallel to the optical axis, and at a preset radius (R) around this axis, at angular intervals which are given, in each case, by $$\Phi_M = M2\pi/N$$

where $M = 1,2,3, \ldots N$ it being possible to represent the potential $\overline{V} = \overline{V}(\Phi_M)$ as the sum of the potentials $$\overline{V}_1 = V_{11} \sin \Phi_M + V_{12} \sin 2\Phi_M + V_{13} \sin 3\Phi_M + V_{14} \sin 4\Phi_M + V_{15} \sin 5\Phi_M + V_{16} \sin 6\Phi_M$$

and $$\overline{V}_2 = V_{21} \cos \Phi_M + V_{22} \cos 2\Phi_M + V_{23} \cos 3\Phi_M + V_{24} \cos 4\Phi_M + V_{25} \cos 5\Phi_M + V_{26} \cos 6\Phi_M$$

15. Process according to claims 13 or 14, characterised in that all the electrodes are arranged parallel to the optical axis (Z), but are not located at a uniform distance therefrom, so that their periphery forms a rectangle, with the optical axis (Z) passing through its central point.

16. Process for adjusting an imaging system for bundles of charged particles, or for adjusting a spectrometer for bundles of charged particles, in which process one or more magnetic correcting elements are used, characterised in that a large number (N) of conductors are used for each magnetic correcting element, through which conductor current flows, and which are arranged, symmetrically or asymmetrically, around the optical axis of the particle bundle, and through which electric currents which are, in general, dissimilar, flow, these currents giving rise to a magnetic flux density (B) which can also be obtained by means of conductors which are arranged parallel to the optical axis (Z), at a uniform distance (R) therefrom, and through which currents flow, of magnitudes such that the current density (i) can be represented, as a function of the azimuth angle ($\Phi$) relative, in the case of a straight optical axis, to this cylindrical surface, or relative, in the case of a curved optical axis, to this toroidal surface, as the sum of $$i_1 = i_{11} \sin \Phi + i_{12} \sin 2\Phi + i_{13} \sin 3\Phi + i_{14} \sin 4\Phi + i_{15} \sin 5\Phi + i_{16} \sin 6\Phi$$

and $$i_2 = i_{21} \cos \Phi + i_{22} \cos 2\Phi + i_{23} \cos 3\Phi + i_{24} \cos 4\Phi + i_{25} \cos 5\Phi + i_{26} \cos 6\Phi,$$

it being possible to set the coefficients $i_{1k}$ and $i_{2k}$, as desired, by selecting values for k from $k = 1$ to 6, so that the currents produce a superposition of a magnetic dipole, of a quadrupole, of a hexapole, of an octapole, of a decapole, and/or of a duodecapole, the orientation, relative to the angle $\Phi = 0$, and the strength of each individual multipole being in every case adjustable as desired.

17. Process according to claim 16, characterised in that N current conductors are arranged parallel to the optical axis (Z), and at a preset radial distance (R) around this axis, at angular intervals which are given, in each case, by $$\Phi_M = M2\pi/N$$

where $M = 0,1,2, \ldots N-1$ it being possible to represent the currents $I = I(\Phi_M)$ in each of these conductors as the sum of $$I_{1M} = I_{11} \sin \Phi_M + I_{12} \sin 2\Phi_M + I_{13} \sin 3\Phi_M + I_{14} \sin 4\Phi_M + I_{15} \sin 5\Phi_M + I_{16} \sin 6\Phi_M$$

and $$I_{2M} = I_{21} \cos \Phi_M + I_{22} \cos 2\Phi_M + I_{23} \cos 3\Phi_M + 24 \cos 4\Phi_M + I_{25} \cos 5\Phi_M + I_{26} \cos 6\Phi_M$$

18. Process according to claims 16 or 17, characterised in that all the current conductors are arranged parallel to the optical axis, but are not located at a uniform distance therefrom, so that their periphery forms a rectangle, with the optical axis (Z) passing through its central point.

19. Process according to claims 13 or 16, characterised in that the sine functions and cosine functions can be replaced by other orthogonal functions.

20. Process according to any one of claims 13 to 19, characterised in that both electrodes and current conductors are used, the electrodes for producing electrical multipole fields, and the conductors for producing magnetic multipole fields.

21. Process according to any one of claims 13 to 20, characterised in that only some of the coefficients $V_{1k}$, $V_{2k}$ and $i_{1k}$, $i_{2k}$ are specified in advance, by prescribing values for k from $k = 1$ to 6, for example only the coefficients $V_{11}$, $V_{21}$ and $i_{11}$, $i_{21}$, while the remaining coefficients are made equal to zero, or the terms corresponding to them are disregarded.

22. Process according to any one of claims 13 to 21, characterised in that the coefficients $V_{1k}$, $V_{2k}$ and $i_{1k}$, $i_{2k}$, in which $k = 1$ to 6, are defined by preset potentials or currents, a network of resistors, diodes and/or transistors being used to apportion these potentials and currents to the individual electrodes or current conductors, in accordance with the function ($\Phi, \Phi_M$) describing their deflection effects in terms of azimuth angle.

23. Process according to any one of claims 13 to 22, characterised in that the potentials of the individual electrodes, or the currents in the individual current conductors, are set by means of one or more process computers, for example by means of a large number of digital/analog converters operating in parallel, or by means of one or more digital/analog converters and analog multiplexers with an appropriate number of outputs and short-term analog memory devices.

24. Process according to any one of claims 13 to 23, characterised in that the magnitudes of the coefficients $V_{1k}$, $V_{2k}$ and $i_{1k}$, $i_{2k}$, in which k=1 to 6, or the magnitudes of the potentials of all the electrodes, and of the currents in all the current conductors, belonging, in each case, to the correcting elements, as well as the magnitudes of the potentials and currents in other components which are employed in the particle spectrometer, for deflecting or focussing purposes, are adjusted by one or more process computers, the adjustment being effected as a function of the particle-current distribution in the image plane, or in an intermediate image plane, or as a function of the particle-current signals in the final target or targets, or in intermediate targets, when the particle bundle is modified in a defined manner by one or more correcting elements, to the zero-th, 1st, 2nd, 3rd, 4th or 5th approximation, that is to say, when it is deflected or focussed, and/or has aberrations of the 2nd, 3rd, 4th and 5th orders impressed on it, additional deflecting capacitors, or short deflecting magnets, with flux lines perpendicular to the optical axis, and/or beam-twisting magnet coils, with flux lines running parallel to the optical axis, being employed in addition to the controlled correcting elements.

* * * * *